United States Patent
Liao et al.

(10) Patent No.: US 7,614,885 B2
(45) Date of Patent: Nov. 10, 2009

(54) SOCKET CONNECTOR HAVING RETAINING TABS ARRANGED ON EDGES OF SIDEWALLS THEREON

(75) Inventors: Fang-Chu Liao, Tu-cheng (TW); Shuo-Hsiu Hsu, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/284,282

(22) Filed: Sep. 18, 2008

(65) Prior Publication Data

US 2009/0075512 A1 Mar. 19, 2009

(30) Foreign Application Priority Data

Sep. 18, 2007 (CN) .................... 200720046654.3

(51) Int. Cl.
*H01R 12/00* (2006.01)
(52) U.S. Cl. ........................................ 439/71
(58) Field of Classification Search .................. 439/71, 439/73, 330, 342
See application file for complete search history.

(56) References Cited

U.S. PATENT DOCUMENTS

| | | | | |
|---|---|---|---|---|
| 4,621,884 A * | 11/1986 | Berkebile et al. | ........... | 439/367 |
| 6,164,980 A | 12/2000 | Goodwin | | |
| 6,699,047 B1 * | 3/2004 | McHugh et al. | ............... | 439/71 |
| 2008/0220628 A1 * | 9/2008 | Liao et al. | ..................... | 439/71 |
| 2009/0081894 A1 * | 3/2009 | Liao et al. | ..................... | 439/81 |

* cited by examiner

*Primary Examiner*—Phuong K Dinh
(74) *Attorney, Agent, or Firm*—Andrew C. Cheng; Wei Te Chung; Ming Chieh Chang

(57) ABSTRACT

A socket connector is provided for securely mounting an IC package (20) on a printed circuit board, said socket connector comprises an insulative housing (30) configured by a base (301) and four perimeter walls (302) to define a inner cavity adapted for receiving said IC package (20). Said four perimeter walls (302) include a first sidewall (3021) with a push finger (3025), a second sidewall (3022), a third sidewall (3023) and a fourth sidewall (3024). Said second sidewall (3022) and said fourth sidewall (3024) further include a plurality of retaining tab (3027) adapted for biasing guiding notches (2011) of said IC package (20) relative to said retaining tab (3027) by a elastic force generated from a push finger (3025) after said IC package (20) is fully mounted in said insulative housing (30) of said socket connector.

2 Claims, 4 Drawing Sheets

SOCKET CONNECTOR HAVING RETAINING TABS ARRANGED ON EDGES OF SIDEWALLS THEREON

BACKGROUND OF THE INVENTION

1. Field of the Invention

The present invention generally relates to an socket connector, and more particularly to an socket connector with retaining tabs formed on edge of sidewall such that an IC package received within said socket connector can be retained by said retaining tabs after said IC package is laterally displaced by a pushing finger formed on said other wall perpendicular to said sidewall with retaining tabs when said IC packaged is installed thereon.

2. Description of Related Art

As the development of electronic technology, the speed of computers are becoming faster and faster for complying with the public's request on data transfer between internet and vividly graphic process. To satisfy a trend of high-speed operation of computers, a central processing unit (CPU), the most important part of a computer, must have more and more contact plugs via a corresponding socket connector for establishing an electrical connection between said CPU and a corresponding circuit board. Said electrical connector has an advantage is that unlike integrated circuit chips that are soldered directly on circuit boards, an integrated circuit plug that is mounted in said socket connector can be easily disconnected from a circuit board for testing and replacement.

As the number of contact plugs of an IC package and passageways in which contact terminals of a socket connector contains increases, there is a instant need to facilitate precise alignment both between said socket connector and said circuit board, and between said IC package and said socket connector due to the relatively dense layout and small size of electrical contacts on said IC package.

Accordingly, U.S. Pat. No. 6,908,316 issues (issued) to Ma on Jun. 21, 2005 disclosed (discloses) a conventional LGA socket connector 1 shown in FIG. 1 includes an stiffener 2, a metal clip 3 pivotally engaged on said stiffener 2, a lever 4 for fastening said clip 3 onto said stiffener 2, and an insulative housing 20 embedded in said stiffener 2. A base 232 and perimeter walls 23 extending upward from said base 232 define an interior cavity adapted for matting an IC package 5 with said socket connector 1. More importantly, an inner side of one of said perimeter walls 23 defines a pair of guiding blocks 2310 protruding towards said cavity, wherein said two guiding blocks 2310 are coplanar with each other. Inner sides of the other perimeter walls 23 define a guiding block 2312 thereof respectively. Therefore, a first benchmark is obtained by a line joining said pair of guiding blocks 2310 on inner side of said perimeter walls 23, and a second benchmark is determined by a line passing said guiding block 2312 on said adjacent and perpendicular wall 23, perpendicular to said first benchmark. U.S. Pat. No. 6,164,980 issued to Goodwin Dec. 26, 2000 discloses another socket connector with push fingers as FIG. 2 is provided to enhance alignment among said IC package, said socket connector and said circuit board. An insulative housing 10 of said socket connector in FIG. 2 includes a base 101 and a plurality of perimeter walls 102 extending upwardly from said base 101 to co-define a receiving cavity for receiving said IC packaged. Furthermore, push fingers 103 are configured on edges of said perimeter walls 102 to which are adjacent each other. Moreover, there are two guiding posts 104 disposed on edges of the other perimeter walls 102 separately facing to said perimeter walls 102 with said push fingers 103. Although said push fingers 103 and said guiding posts 104 are effectively aligned said IC package, said socket connector and said printed circuit board one another, it is not sufficient to ensure that said IC package be securely mounted in said socket connector. The main cause is that unbalance forces between said IC package and said perimeter walls make said IC package easily slide out of said socket connector from said inclined guiding surface of said guiding posts 104. Therefore, there is a need to offer an improved socket connector to ensure an IC packaged is securely mounted in said socket connector.

BRIEF SUMMARY OF THE INVENTION

An object of the present invention is to provide a socket connector that effectively avoids a risk of an IC package sliding out of said socket connector.

A socket connector of the present invention comprises an insulative base, a plurality of opposing perimeter walls extending upwardly from said base, said base interconnecting and extending substantially an entire distance between each of said opposing perimeter walls and providing a substantially continuous contact receiving surface between said perimeter walls, said perimeter walls defining a cavity therebetween and above said base adapted for receiving an IC package. At least two opposite perimeter walls each provided with at least a retaining tab on an edge of said opposite perimeter walls and extending into said cavity, and defining a gap between a lower surface of said retaining tab and said contact receiving surface. A push finger provides on at least one of the rest of said opposite perimeter walls, which is perpendicular to said opposite walls having said retaining tabs, and has a biasing point extending into said cavity.

The present invention includes a method of assembling an IC package in a socket connector comprising following steps: (a) providing a base with perimeter walls extending upward therefrom to defining a cavity, said cavity further comprising a contact receiving surface thereon; (b) providing a pair of retaining tabs formed on opposite perimeter walls, each retaining tab defining a gap between a lower surface of said retaining tab and said contact receiving surface; (c) providing at least a biasing tab formed on a opposite perimeter wall adjacent to said opposite perimeter walls; (d) providing an IC package having least a pair of notches corresponding to said retaining tabs; (e) aligning said notches with said retaining tabs on an edge of opposite perimeter walls; (f) pressing said IC package downward and pushing said biasing tab outward for electrically connecting said IC package with said socket connector; and (g) releasing said IC package such that an elastic force come from said biasing tabs push said IC package inward for forming a biasing between said retaining tabs and said guiding notches.

Other objects, advantages and novel features of the invention will become more apparent from the following detailed description of the present embodiment when taken in conjunction with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE INVENTION

Figure 1:
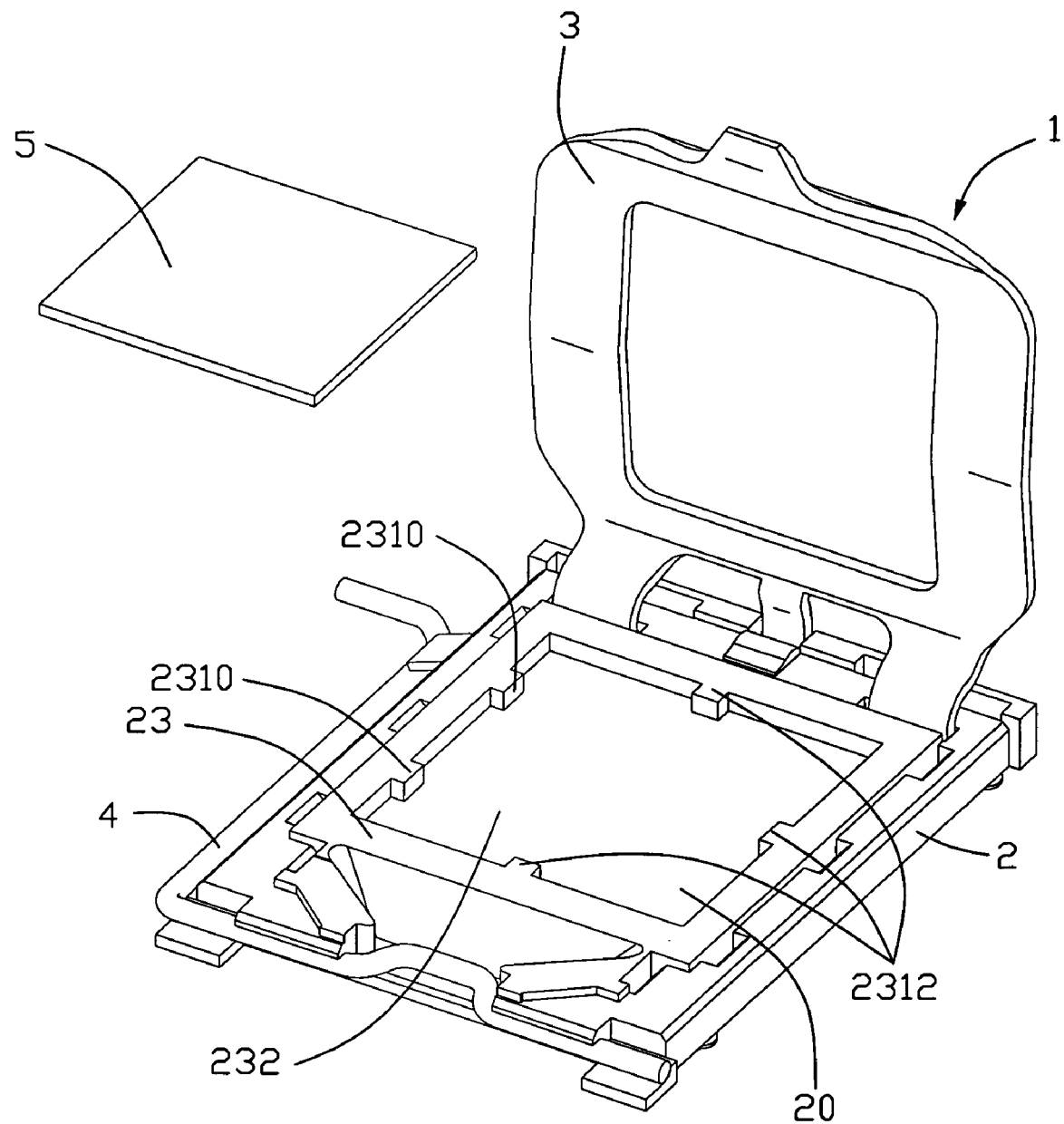
FIG. 1 illustrated an isometric view of a conventional socket connector and a corresponding IC package.
Figure 2:
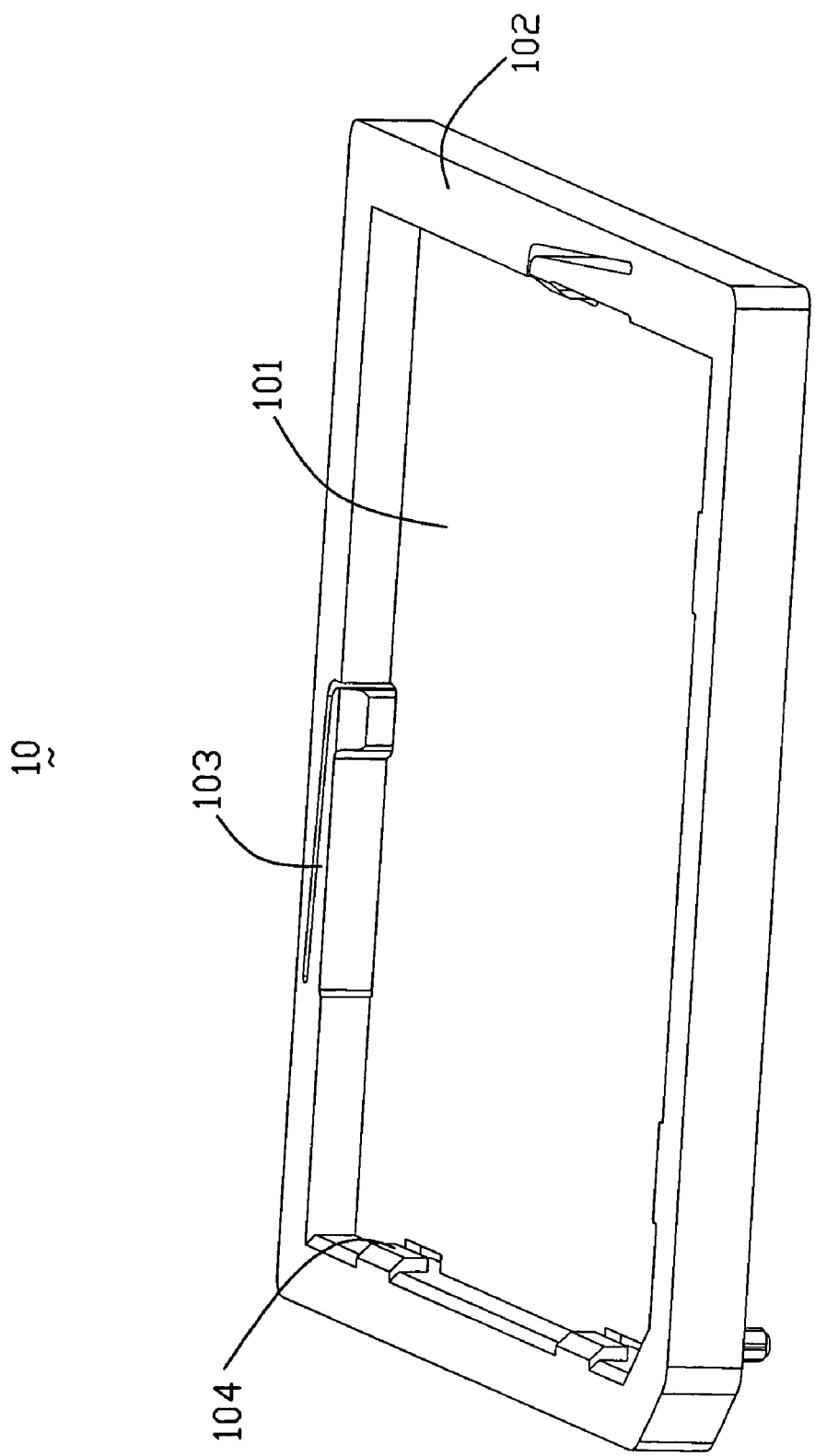
FIG. 2 illustrates an isometric view of an insulative housing of a conventional socket connector.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 3:
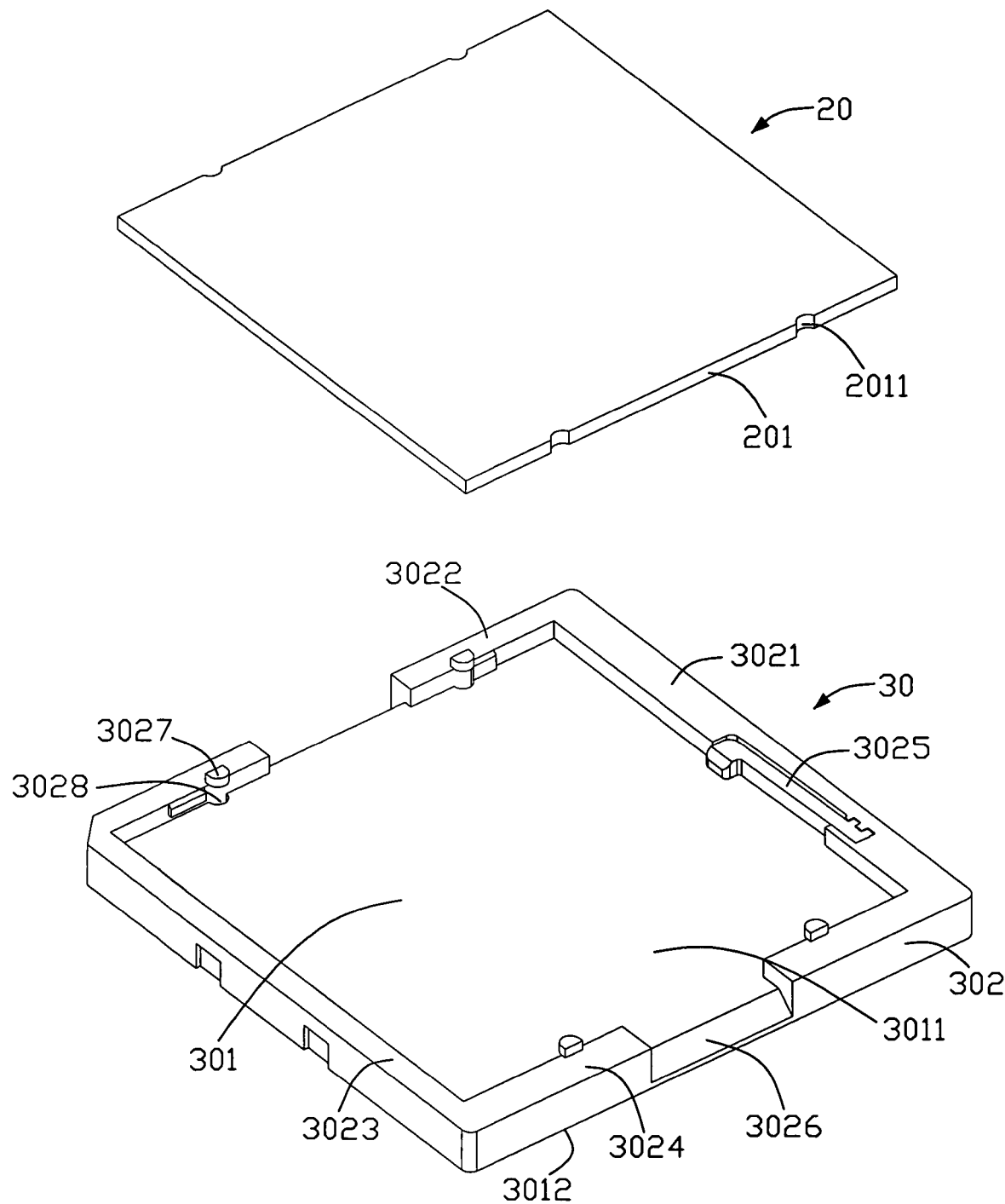
FIG. 3 illustrates an isometric view both of an IC package and a socket connector before said IC package is mounted in said socket connector in accordance with the preferred embodiment of the present invention.

Referring to FIG. 3, a socket connector of the present invention comprise an insulative housing 30 having a base 301 and a plurality of opposing perimeter walls 302 extending upwardly from said base 301, said base 301 interconnecting and extending substantially an entire distance between each of said opposing perimeter walls 302 and providing a substantially continuous contact receiving surface 3011 on an upward surface of said base 301 between said perimeter walls, said perimeter walls defining a cavity therebetween and above said base adapted for receiving an IC package, such as a central processing unit (CPU). It should be appreciated that said contact receiving surface 3011 comprising a plurality of passageways in specific area in which a plurality of contact terminals are constrained adapted for electrically connecting said IC package 20 with said socket connector, and a downward surface of said base 301 is a solder surface 3012 adapted for soldering said socket connector with a circuit board. In the preferred embodiment of the present invention, said opposing perimeter walls have a first sidewall 3021, a second sidewall 3022, a third sidewall 3023 and a fourth sidewall 3024. Said first sidewall 3021 comprise a push finger 3025 with an inclined guiding surface at a free end thereof disposed on the edge of said first sidewalls adapted for easily mounting said IC package 20 in socket connector. In addition, two retaining tabs 3027 are respectively disposed on the edge of said second sidewall 3022 and said fourth sidewall 3024 adjacent to and perpendicular to said first sidewall 3021. It should be recognized that said retaining tabs 3027 could be any shape, such as bump, columnar, strip, lump, spheral, trapezoid, prism and block. As a result, said IC package 20 may have corresponding guiding notches 2011, which shape are fitted in with the shape of said retaining tabs 3027, on corresponding sides 201 of said IC package 20 such that said guiding notches 2011 may smoothly pass through said retaining tabs 3027 for mounting said IC package 20 in said contact receiving surface 3011. In addition, both of said second sidewall 3022 and said fourth sidewall 3024 further comprise a corresponding aslope surfaces 3026 adapted for conveniently removing IC package 20 from said socket connector by a user. It should be noted that a angle between said aslope surface and a surface parallel to said solder surface is within in the range from 0~180 degree. Moreover, said base 301 further comprises base recesses 3028 adapted for taking said shaped insulative housing 30 out of a molding die during manufacture of said insulative housing 30.

Figure 4:
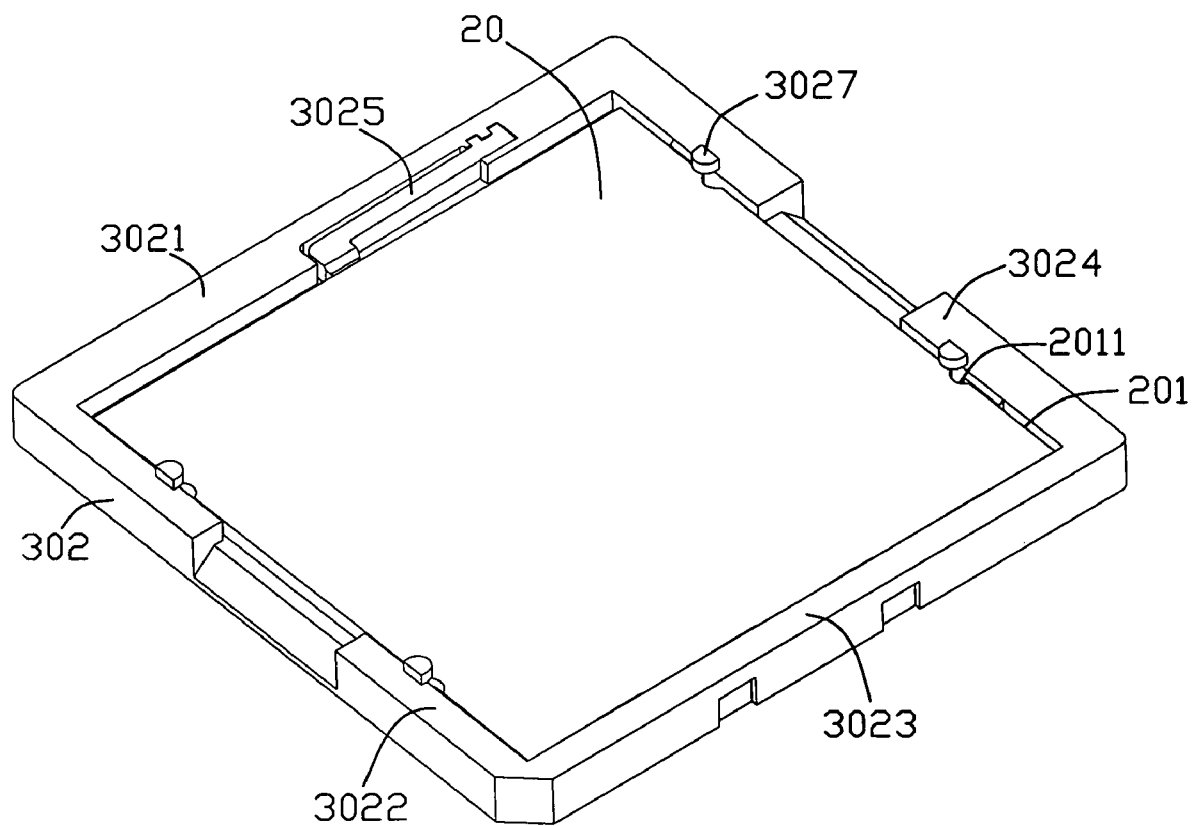
FIG. 4 illustrates an isometric view of a combination of an IC packaged and a socket connector after said IC package is mounted in said socket connector in accordance with the preferred embodiment of the present invention.

Referring to FIG. 3 and FIG. 4, it should be appreciated that said opposing perimeter walls 3022 and 3024 with said retaining tabs 3027 defines a gap between a lower surface of said retaining tab 3027 and said contact receiving surface 3011. Accordingly, while a user may align said guiding notches 2011 with the retaining tabs 3027 first, then presses the IC package 20 downward to said contact receiving surface 3011 guiding by the retaining tabs 3027 for electrically connecting said IC package 20 with said socket connector, an elastic force come from said inclined guiding surface of said push finger 3025 push said IC package 20 laterally displaced so as to form a biasing between said retaining tabs 3027 and said guiding notches 2011 thereafter. Consequently, said IC package 20 can be securely mounted in said insulative housing 30 of said socket connector and effectively avoid a risk of sliding said IC package 20 out of said insulative housing 30 during a period of either move or assembly of a computer system.

Although the present invention has been illustrated and described with respect to exemplary embodiment thereof, it should be understood by those skilled in the art that the various changes, omissions and additions may be made therein and thereto without departing from the spirit and scope of the present invention as set forth in the appended claims.

What is claimed is:

1. A method for assembling an IC package in a socket connector comprising the steps of:
    (a) providing a base with perimeter walls extending upward therefrom to defining a cavity, said cavity further comprising a contact receiving surface thereon;
    (b) providing a pair of retaining tabs formed on opposite perimeter walls, each retaining tab defining a gap between a lower surface of said retaining tab and said contact receiving surface;
    (c) providing at least a biasing tab formed on a opposite perimeter wall adjacent to said opposite perimeter walls;
    (d) providing an IC package having least a pair of notches corresponding to said retaining tabs; one on each opposite perimeter walls;
    (e) aligning said notches with said retaining tabs on an edge of opposite perimeter walls;
    (f) pressing said IC package downward and pushing said biasing tab outward for electrically connecting said IC package with said socket connector; and
    (g) releasing said IC package such that an elastic force come from said biasing tabs push said IC package inward for forming a biasing between said retaining tabs and top face positions along side edge region of the IC package besides said notches, wherein said retaining tab can be any shape, wherein said notches having the same shape as the one of said retaining tab for passing the IC package through said retaining tab and being mounted in said socket connector, wherein the shape of said retaining tap is selected from the group comprising bump, semi-columnar, strip, lump, semi-spherical, trapezoid, prism and block, wherein said base and said perimeter walls is made of insulative material, wherein said biasing tab further comprising a biasing point at a free end thereof extending into said cavity, wherein the biasing tab abuts against a side face of the IC package while the retaining tab abuts against a top face of the electronic package.

2. An electrical connector assembly for use with an electronic package having a notch in a side edge thereof, comprising:
    an insulative housing including a bottom base with a plurality of side walls commonly defining an upward facing receiving cavity therein;

a plurality of contacts disposed in the housing with contacting sections upwardly extending into the receiving cavity;

at least one retaining tab disposed on at least one of said side walls, spaced from the bottom base and downwardly facing the receiving cavity under a condition that a size of the retaining tab is compliant with said notch; and at least one push finger located around another of said side walls whereby the electronic package is allowed to initially be downwardly loaded into the receiving cavity under a situation of the notch being aligned with the retaining tab and passing therethrough, and successively horizontally moved due to a force generated by said push finger so as to have the notch and the retaining tab offset from each other accordingly and have the retaining tab downwardly press a top position of a side edge region of the electronic package beside said notch, wherein said one side wall is neighbored to said another side wall, wherein at least one of said retaining tab and said push finger is unitarily formed with the housing, wherein said bottom base defines a through hole beside said one side wall and in alignment with said retaining tab for ejection molding consideration to form said housing, wherein the push finger abuts against a side face of the electronic package while the retaining tab abuts against a top face of the electronic package, wherein said notch is offset from the retaining tab in a direction along which said push finger exerts a force.

* * * * *